United States Patent [19]

Suma et al.

[11] Patent Number: 4,680,763
[45] Date of Patent: Jul. 14, 1987

[54] DIGITAL DATA RECORDING AND REPRODUCING DEVICE

[75] Inventors: Tetsuro Suma; Takao Abe; Tetsuo Ogawa, all of Kanagawa, Japan

[73] Assignee: Sony Corporation, Tokyo, Japan

[21] Appl. No.: 647,443

[22] Filed: Sep. 5, 1984

[30] Foreign Application Priority Data

Sep. 8, 1983 [JP] Japan ................................. 58-165677

[51] Int. Cl.$^4$ ............................................. G06F 11/10
[52] U.S. Cl. ..................................... 371/37; 360/38.1; 360/53; 371/38
[58] Field of Search ................... 371/38, 37; 360/38.1, 360/53; 358/336

[56] References Cited

U.S. PATENT DOCUMENTS

| 4,215,335 | 7/1980 | Doi et al. ........................ 371/38 X |
| 4,306,305 | 12/1981 | Doi et al. ............................ 371/38 |
| 4,314,369 | 2/1982 | Caillet et al. ......................... 371/69 |
| 4,321,704 | 3/1982 | Lemoine ........................... 371/37 X |
| 4,329,708 | 5/1982 | Yamamoto et al. ............... 371/38 X |
| 4,437,125 | 3/1984 | Yamamoto ..................... 360/38.1 X |
| 4,497,055 | 1/1985 | Hoshino et al. ............... 360/38.1 X |

Primary Examiner—Charles E. Atkinson
Attorney, Agent, or Firm—Lewis H. Eslinger; Alvin Sinderbrand

[57] ABSTRACT

A digital data recording and reproducing device has an operation of error detection performed with respect to data with a code word length of M bits for $m_1$ most significant bits and for $m_2$ least significant bits. Error concealment is done for each of these error detections. When reproducing data at a different tape speed from that at the time of recording an operation of detecting an error in the less significant $m_2$ bits is inhibited, and the reference of judgement of an error in the data is altered.

4 Claims, 7 Drawing Figures

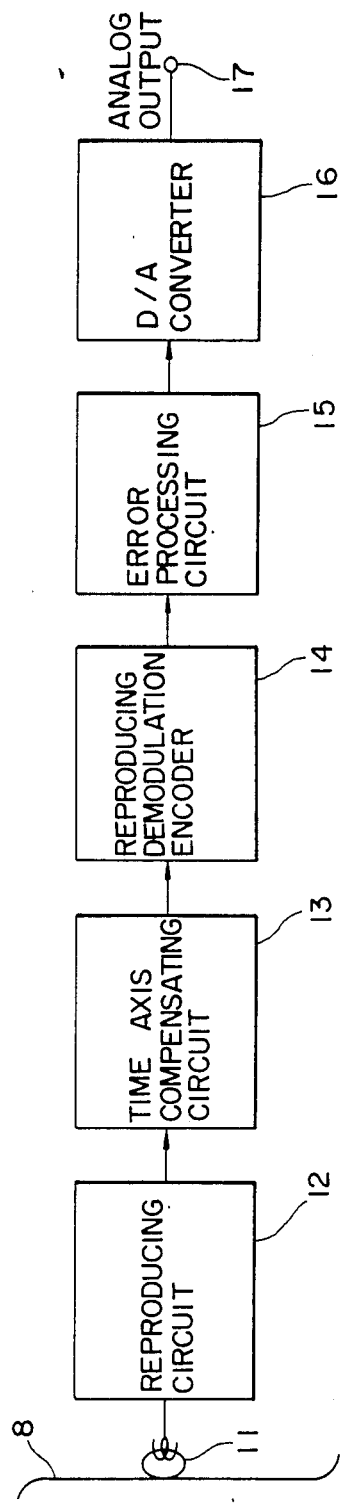
F I G. 3

DIGITAL DATA RECORDING AND REPRODUCING DEVICE

BACKGROUND OF THE INVENTION

1. Field of the Invention

This invention relates to a digital data recording and reproducing device such as a so-called digital video tape recorder for recording and reproducing digital video signals.

2. Description of the Prior Art

In the usual digital video tape recorder, digital video signals are recorded together with redundant bits for protecting digital video signals transmitted through a recording and reproducing system. In such a system, the reproduced digital video signal obtained in the reproducing system is processed for data error correction using said redundant bits. Subsequently, a check is done as to whether there is any error in the corrected data, and then an error concealment is effected, in which erroneous data that could have not been corrected by said data error correction is interpolated with adjacent correct data.

Meanwhile, in the prior art digital video tape recorder the error concealment is done by making a check as to whether there is any error in the reproduced digital video signal using the same judgement level during a reproducing operation at a different tape speed from the tape speed at the time of the recording as that during the normal reproducing operation. In a tape recorder of helical scan type utilizing a rotary head, however, large portions of the recorded signal may be skipped during the different speed reproducing operation. For this reason, when a digital video signal is dealt with, the minimum amount of data needed to be free from error for sufficient error concealment is missing the reproduced digital signal, so that considerable errors appear in the reproduction on the screen.

SUMMARY OF THE INVENTION

The present invention was made in the light of the above problem in the different speed reproducing operation of the prior art digital video tape recorder, and its object is to provide a signal processing technology, in which the detection of an error in data with a code word length of M bits is done with only upper or the most significant bits. In the prior art, of the reproduced data with many errors obtained in the different speed reproducing operation of the helical scan type video tape recorder, those data which include an error in the lower or less significant bits are discarded. According to the present invention, such data are accepted as accurate data, and errors that are noticeable in the reproduction on the screen are reliably suppressed while ignoring lower bit errors which have less adverse effects, thus permitting a different speed reproduction which permits a satisfactory image quality to be obtained on the screen as a whole.

BRIEF DESCRIPTION OF THE DRAWINGS

FIG. 3 is a block diagram showing a reproducing system in the embodiment;

FIGS. 5 to 7 are views for explaining the probability of occurrence of error in data by comparing a prior art code format and a code format according to the present invention, in which:

FIG. 5 is a view showing the prior art code format;

FIG. 6 is a view showing the code format in the embodiment; and

FIG. 7 is a graph showing characteristic curves representing the results of calculatiion of probability in the prior art case and the case according to the present invention.

DETAILED DESCRIPTION OF THE PREFERRED EMBODIMENT

Now, an embodiment of a digital data recording and reproducing device according to the present invention will be described in detail with reference to the accompanying drawings.

Figure 1:
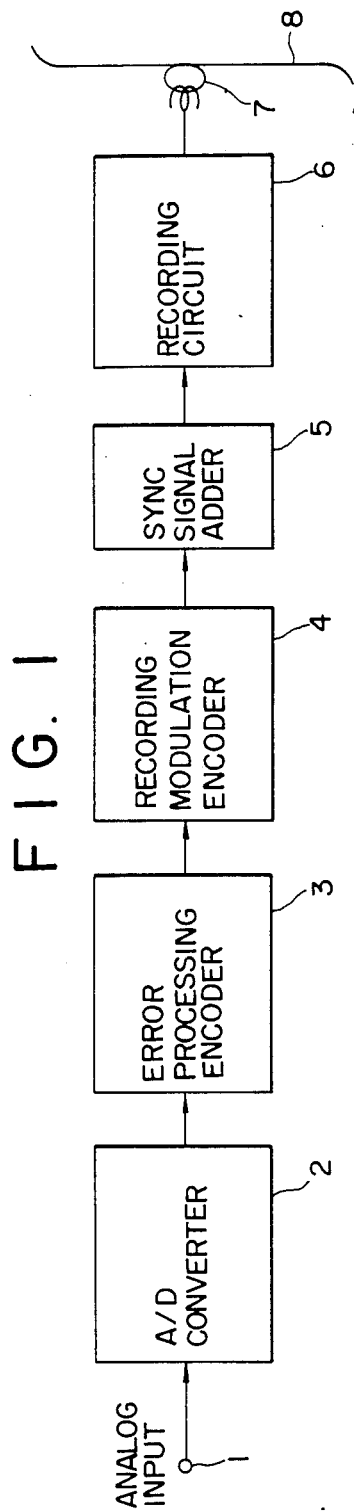
FIG. 1 is a block diagram showing a recording system of an embodiment of the present invention applied to a digital video tape recorder.

FIG. 1 is a block diagram showing a recording system of an embodiment of the present invention applied to a digital video tape recorder of helical scan type.

In this embodiment, an analog input video signal is supplied to a signal input terminal 1. This analog input video signal is supplied from said signal input terminal 1 to an analog-to-digital (A/D) converter 2. Said A/D converter 2 converts the input analog signal to a digital video signal showing from the data of which is provided with weights from the MSB to the LSB with the M bits as one sample. The M-bit digital video signal data (hereinafter referred to as recording input data) obtained from said A/D converter 2 is supplied to an error processing encoder 3.

Figure 2:
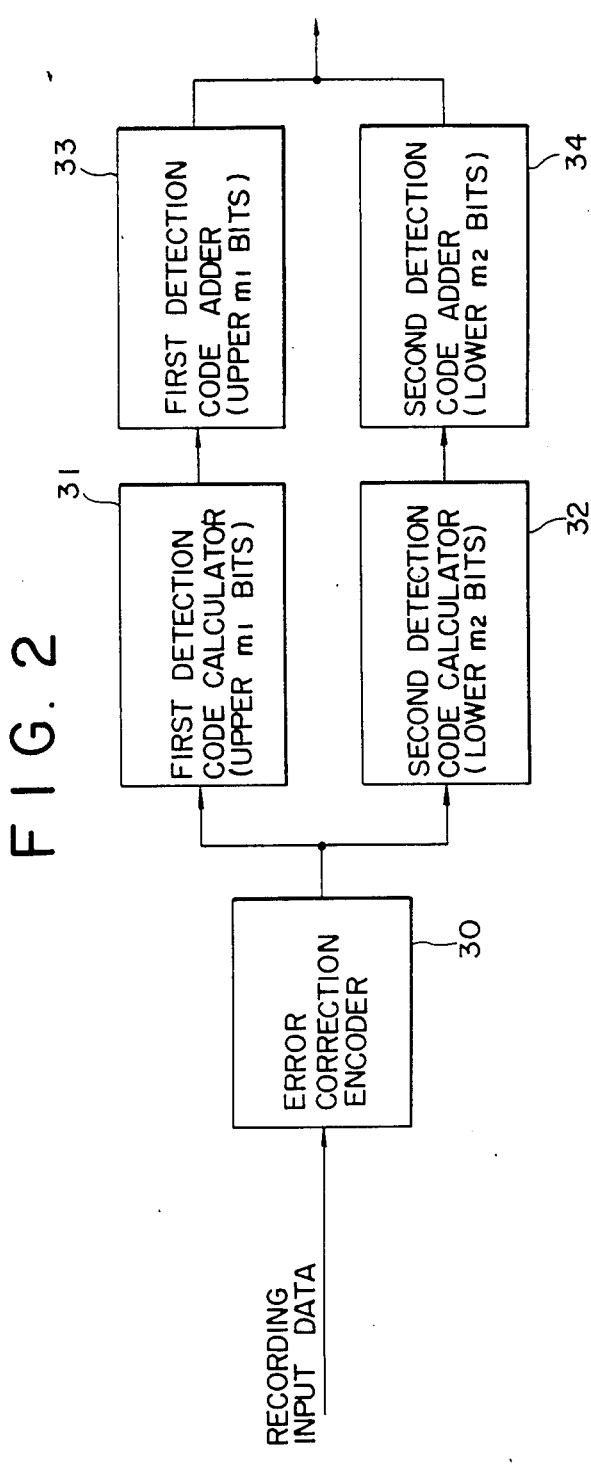
FIG. 2 is a block diagram showing a specific example of an error processing encoder provided in said recording system.

Said error processing encoder 3, as shown in FIG. 2, includes an error correction encoder 30, first and second detection code calculators 31 and 32 and first and second detection code adders 33 and 34. Said error correction encoder 30 adds a general error correction code such as CRCC as a redundant bit to the recording input data consisting of M bits for one sample supplied from said A/D converter 2. The recording input data with the error correction code added thereto in the error correction encoder 30, is supplied to said first and second detection code calculators 31 and 32. Said first detection code calculator 31 calculates from said recording input data a first detection code for detecting an error in the $m_1$-MSB bits of the data during a reproducing operation to be described later. Said first detection code adder 33 adds the first detection code calculated by said first detection code calculator 31 as a redundant bit to the data of said MSB $m_1$ bits. Likewise, through said second detection code calculator 32 and second detection code adder 34 a second detection code is calculated with respect to the $m_2$ LSB bits in said recording input data, and the second detection code is added as a redundant bit.

The recording input data with error correction code and detection code added thereto in said error processing encoder 3, is supplied through a recording modulation encoder 4 for encoding processing including a reduction of the DC component. The output of the recording modulation encoder 4 is supplied to a synchronizing signal adder 5 for addition of a synchronizing signal bit to it before it is supplied to a recording circuit 6. This recording circuit 6 performs recording equalization and recording amplification of the recording input data supplied from said synchronizing signal adder 5. The resultant recording input data from the recording circuit 6 is supplied to a recording head 7. The recording input data supplied to the recording head 7 is recorded by aslant recording on a magnetic tape 8.

FIG. 3 is a block diagram showing a reproducing system of the embodiment.

In this embodiment, the reproduced signal reproduced from said magnetic tape 8 by a reproducing head 11 is supplied to a reproducing circuit 12. The reproducing circuit 12 performs reproducing amplification and reproducing equalization to reproduce clock and data.

The reproduced data obtained from said reproducing circuit 12 is supplied to a time axis compensating circuit 13 for removal of jitter component. The time axis compensating circuit 13 also has a function of forming a synchronizing signal from a synchronizing bit in the reproduced data.

Figure 4:
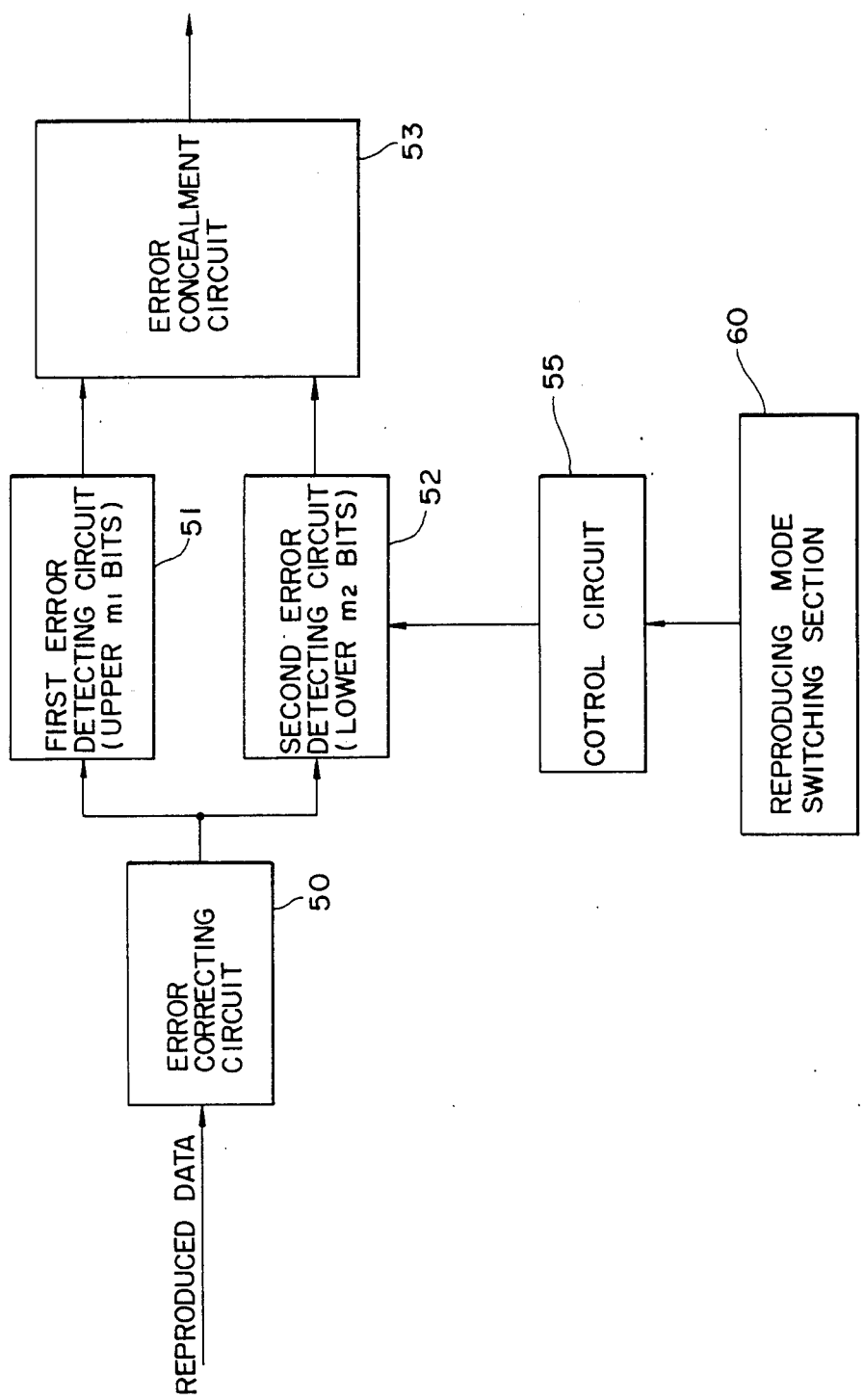
FIG. 4 is a block diagram showing a specific example of an error processing circuit provided in the reproducing system.

The reproduced data free from the jitter component, which is obtained from the time axis compensating circuit 13, is supplied through a reproducing demodulation encoder 14 to an error processing circuit 15. The error processing circuit 15 performs an error processing. More particularly, said error processing circuit 15, as shown in FIG. 4, includes an error correcting circuit 50, first and second error detecting circuits 51 and 52 and first and second error concealment circuits 53. Said reproduced data is supplied through the error correcting circuit 50 to the error detecting circuits 51 and 52. Said error correcting circuit 50 performs error correction of the input reproduced data on the basis of the correction code added as redundant bit. Said first detecting circuit 51 performs error detection of the error corrected reproduced data obtained from said error correcting circuit 50 on the basis of the first detecting signal added as redundant bits to the MSB $m_1$ bits. Likewise, the second error detecting circuit 52 performs error detection of the same error corrected reproduced data on the basis of the second detecting signal added as redundant bits to the LSB $m_2$ bits. When the detection signal is supplied from either first or second error detecting circuit 51 and 52 the error correcting circuit 53 performs error concealment of the supplied reproduced data.

Said second error detecting circuit 52 can be switched by a control circuit 55, which is interlocked to a reproducing mode switching section 60 of the video tape recorder of the embodiment, such that it performs the error detecting operation as noted above during the normal reproducing operation mode while it does not perform any error detecting operation during the different speed reproducing operation mode.

The error corrected reproduced data obtained from said error processing circuit 15 is supplied to a digital-to-analog (D/A) converter 16 for conversion to an analog reproduced video signal which is provided from a signal output terminal 17.

In the video data recorder of the above construction, error detection is performed with respect to all the M bits of the $m_1$ MSB bits and $vm_2$ LSB bits of the reproduced data during the normal reproducing operation mode. That is, error detection with reference to the same judgement reference as in the prior art is performed. In this way, the error concealment can be obtained.

During the different speed reproducing operation mode, error detection is performed with respect to only the $m_1$ MSB bits of the reproduced data. In this way, error concealment alleviating the judgement reference can be obtained. If there is any error in the $m_2$ LSB bits, it has no substantial effect on the image quality of the reproduced image. By performing the error concealment operation as described above only on the MSB data that significantly influences the image quality of the reproduced image, the probability that all the M-bit reproduced data is judged to be erroneous can be reduced. Thus, it is possible to ensure a great quantity of effective data and improve the image quality by the error concealment.

Figure 5:
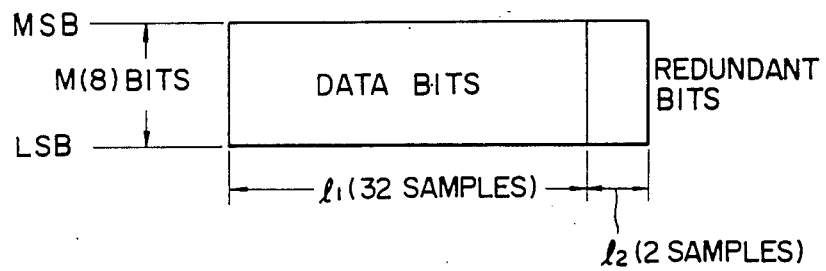

The probability that an error is generated in the M-bit data in the above embodiment is compared to that in the prior art as follows. In case where data consisting of M bits for one sample is dealt with such that data length for $l_1$ samples is handled as one data block and that the redundant bits for $l_2$ samples are added to one data block, the probability $P_1$ that an error is contained in the data bits or redundant bits, can be expressed in the prior art case of a code format as shown in FIG. 5 as $$P_1 = 1 - (1 - P_{SE})^{(l_1 + l_2)} \quad (1)$$

Figure 6:
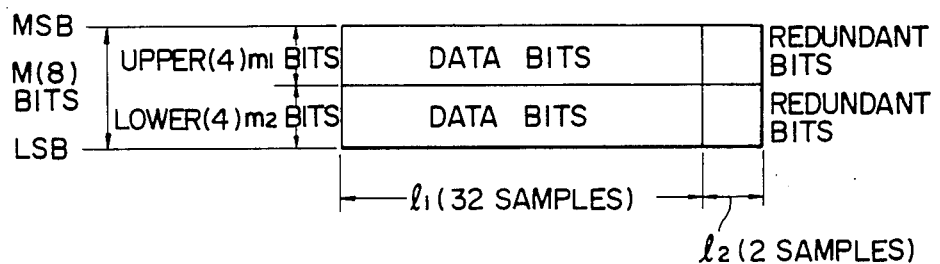

In the case of a code format according to the above embodiment as shown in FIG. 6, the probability $P_2$ is $$P_2 = 1 - (1 - P_{SE4})^{(l_1 + l_2)} \quad (2)$$

In equation (1), $P_{SE}$ represents a sample error rate in the data bits or redundant bits. Denoting the bit error rate of said data bits or redundant bits by $P_{BE}$, $$P_{SE} = 1 - (1 - P_{BE})^{M/SAMPLE} \quad (3)$$

In the equation (2), $P^{SE4}$ represents an equivalent sample rate in the case of the code format shown in FIG. 6. In case when $M=8$ and $m_1=m_2=4$, $$P_{SE4} = 1 - \sqrt{1 - P_{SE}} \quad (4)$$

Figure 7:
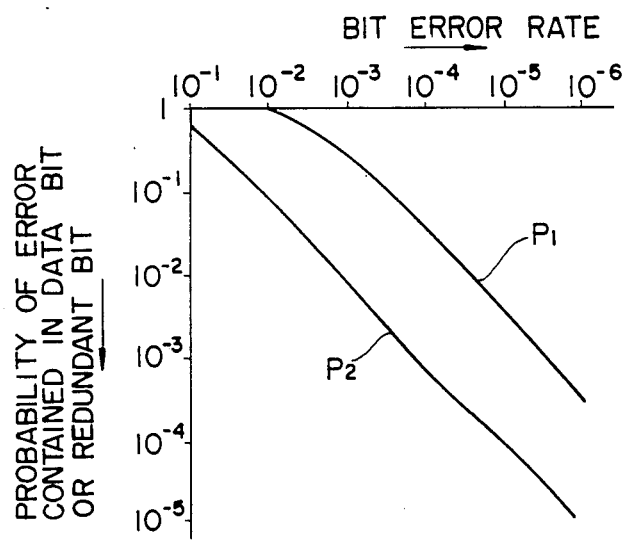

When said probabilities $P_1$ and $P_2$ are actually calculated by substituting $l_1=32$ samples and $l_2=2$ samples, said probabilities $P_1$ and $P_2$ are expressed as respective characteristic curves in the graph of FIG. 7 where the abscissa is the bit error rate $P_{BE}$.

What is claimed is:
1. A digital data recording and reproducing device for recording and reproducing a recording data signal consisting of data having a code word length of M bits comprising:
first detection code calculating means for calculating at least one first redundant bit representing a first detection code for detecting an error of data of the $m_1$ most significant bits of the code words of M bits during reproduction and first detection code association means for associating each said first redundant bit as the first detection code with said $m_1$ most significant bits;
second detection code calculating means for calculating at least one second redundant bit representing a second detection code for detecting an error of data of the $m_2$ least significant bits of the code words of M bits during reproduction and second detection code association means for associating each said second redundant bit as the second detection code with said $m_2$ least significant bits;

signal recording means for recording said recording data signal with said first and second redundant bits associated therewith on a recording medium;

signal reproducing means for reproducing the recorded signal to provide a reproduced data signal from said recording medium; and signal processing means for processing said reproduced data signal in response to said first and second redundant bits, said signal processing means including first error detecting means for producing a first detection signal by detecting an error of said $m_1$ most significant bits in response to said first redundant bit of said reproduced data signal, second error detecting means for producing a second detection signal by detecting an error of said $m_2$ least significant bits in response to said second redundant bit of said reproduced data signal, and concealing means for concealing errors in said reproduced data signal if either said first or second detection signal is provided.

2. A digital data recording and reproducing device for recording and reproducing a recording data signal consisting of data having a code word length of M bits comprising:

first detection code calculating means for calculating at least one first redundant bit as a first detection code for detecting an error of data of the $m_1$ most significant bits of the code words of M bits during reproduction and first detection code association means for associating each said first redundant bit as the first detection code with said $m_1$ most significant bits;

second detection code calculating means for calculating at least one second redundant bit as a second detection code for detecting an error of data of the $m_2$ least significant bits of the code words of M bits during reproduction and second detection code association means for associating each said second redundant bit as the second detection code with said $m_2$ least significant bits;

signal recording means for recording said recording data signal with said first and second redundant bits associated therewith on a recording medium;

signal reproducing means for reproducing the recorded signal to provide a reproduced data signal from said recording medium;

signal processing means for processing said reproduced data signal in response to said first and second redundant bits, said signal processing means including first error detecting means for producing a first detection signal by detecting an error of said $m_1$ most significant bits in response to said first redundant bit of said reproduced data signal, second error detecting means for producing a second detection signal by detecting an error of said $m_2$ least significant bits in response to said second redundant bit of said reproduced data signal, and concealing means for concealing errors in said reproduced data signal if either said first or second detection signal is provided; and control means for selectively stopping the operation of said second error detecting means to place said digital data recording and reproducing device in an operating mode in which said concealing means operates in response to only the first detecting signal provided from said first error detecting means.

3. A digital data recording and reproducing device according to claim 2, wherein said recording data signal is a digital video signal, a magnetic tape is used as said recording medium and slant recording tracks on said magnetic tape are traced with a rotary head for recording and reproduction of said digital video signal.

4. A digital data recording and reproducing device according to claim 3, further comprising means for switching a reproducing speed of said device to place said device in a different speed reproducing operation mode in which the reproduction of data is carried out at a different tape speed from that during recording, said control means being interlocked with said means for switching to hold said second error detecting means inoperative in said different speed reproducing operation mode.

* * * * *